United States Patent
Moon (10) Patent No.: US 7,820,344 B2
(45) Date of Patent: Oct. 26, 2010

(54) METHOD FOR FORMING LINE PATTERN ARRAY, PHOTOMASK HAVING THE SAME AND SEMICONDUCTOR DEVICE FABRICATED THEREBY

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 390 days.

(21) Appl. No.: 11/957,019

(22) Filed: Dec. 14, 2007

(65) Prior Publication Data

US 2008/0315323 A1  Dec. 25, 2008

(30) Foreign Application Priority Data

Jun. 25, 2007  (KR) ............... 10-2007-0062546

(51) Int. Cl.
*G03F 1/00* (2006.01)
*G03F 7/00* (2006.01)
*G06F 17/50* (2006.01)

(52) U.S. Cl. ............... 430/5; 430/311; 716/19
(58) Field of Classification Search ............ 430/5, 430/311–313; 716/19; 438/128, 129
See application file for complete search history.

(56) References Cited

U.S. PATENT DOCUMENTS

| 6,333,213 | B2 * | 12/2001 | Hasebe et al. ............ 438/129 |
| 6,977,715 | B2 | 12/2005 | Wu ............... 355/53 |
| 6,983,444 | B2 | 1/2006 | Yang ............... 716/19 |
| 2005/0026047 | A1 * | 2/2005 | Yang ............... 430/5 |
| 2006/0093926 | A1 * | 5/2006 | Fujisawa et al. ............ 430/5 |
| 2006/0234139 | A1 | 10/2006 | Watson et al. ............ 430/5 |

FOREIGN PATENT DOCUMENTS

| KR | 10-2005-0066847 | 6/2005 |
| KR | 10-2006-0052324 | 5/2006 |

* cited by examiner

*Primary Examiner*—Stephen Rosasco
*Assistant Examiner*—Stewart A Fraser
(74) *Attorney, Agent, or Firm*—Marshall Gerstein & Borun LLP (57) ABSTRACT

A method of forming a line pattern array comprises the steps of setting a layout which includes first continuous line patterns arranged to have a first line width and a second continuous line pattern arranged to have a second line width larger than the first line width and positioned outside the first continuous line patterns; transferring the layout on a wafer; and inducing light scattering by changing an outermost pattern of the first continuous line patterns, which is most closely adjacent to the second continuous line patterns, into a plurality of dotted line patterns, wherein the plurality of the dotted patterns are arranged in a line form in order that a line pattern, which is different from the first continuous line patterns in line width, is formed based on a size of the dotted patterns.

20 Claims, 5 Drawing Sheets

METHOD FOR FORMING LINE PATTERN ARRAY, PHOTOMASK HAVING THE SAME AND SEMICONDUCTOR DEVICE FABRICATED THEREBY

CROSS-REFERENCES TO RELATED APPLICATION

The priority of Korean application number 10-2007-0062546, filed on 25 Jun. 2007, is hereby claimed and the disclosure thereof is incorporated herein by reference in its entirety.

BACKGROUND OF THE INVENTION

The present invention relates to a semiconductor device, and, more particularly, to a method of forming a line pattern array, a photomask having the same and a semiconductor device fabricated thereby.

In order to implement a semiconductor device having a circuit pattern on a wafer, a microlithography process is performed. The microlithography process includes a process of forming a photomask through a mask pattern layout to be implemented on a transparent substrate. The mask pattern is transferred onto a photoresist layer deposited on the wafer by an exposure process using the mask. In such a pattern transferring process, it can be difficult for a wafer pattern formed on the wafer, namely, a photoresist pattern, to have a line width corresponding to a designed target critical dimension (CD).

In case of a memory semiconductor device such as a DRAM device or a NAND flash device, it has a cell area in which memory cells are repetitively arranged. Line patterns, which form conductive layers such as gate patterns of transistors in the cell area, are repetitively arranged with a constant line width and spacing. Since the line patterns are repeated at a substantially same pitch in the cell area, there are several equal patterns around one line pattern.

However, in case of a line pattern arranged at an outermost side, such an outermost line pattern may be adjacent to other cell line patterns in one direction with the same width and space, however, the line pattern may not be adjacent to such the same line patterns or be adjacent to other cell line patterns which have a substantially different line width and space in the opposite direction. For example, a dummy line pattern, which has a larger line width and a first space larger than a second space of the cell line patterns, is arranged outside the outermost line pattern. The dummy line pattern is introduced to suppress an influence of the local etch loading effect on the outermost line pattern in a selective etching process which is performed after the pattern transferring process.

The outermost line pattern is partially influenced by the dummy line pattern because an optical circumstance, for example, the optical proximity effect (OPE) during an exposure process, at the outermost line pattern is different from that at other cell line patterns which are inside. Since the outermost line pattern is transferred under such an optical effect, it is difficult to secure a CD of a wafer pattern, for example, a photoresist pattern, corresponding to a designed target line width. Further, in case that it is necessary to secure the line width of the outermost line pattern larger than that of the inner line patterns, it is difficult to obtain such a wide width of the outermost line pattern, and then the outermost line pattern finally formed on the wafer may have a line width smaller than the target line width because the line width of the outermost line pattern formed on the wafer does not get substantially larger although the layout of the outermost line pattern is set to be a wide line width on a mask.

Considering an exposure contrast at the time of exposing the outermost line pattern, the exposure contrast is substantially influenced by a larger pitch of the dummy line pattern arranged outside the outermost line pattern. Thus, if the line width of the outermost line pattern is intentionally changed, the exposure contrast according to the change of the line width is limited. Therefore, a change of the line width of a substantially formed wafer pattern according to the line width change of the outermost line pattern is excessively limited. Also, an excessive expansion of the line width of the outermost line pattern can cause an undesired bridge defect between the outermost line pattern and the dummy pattern. Further, since the pitch of the dummy line pattern arranged outside the outermost line pattern is set considering an etch loading effect, it is difficult to change the pitch of the dummy line pattern arbitrarily. Thus, in a state that the change of the pitch of the dummy line pattern is limited, the control of the line width of the outermost line pattern is getting more difficult in a cell line pattern array.

Nonetheless, considering an operation of an actual memory device, it is required for the outermost cell line pattern to have a line width larger than that of other inside cell line patterns in order to suppress disturbance with the other inside cell line patterns or improve a line resistance of the outermost cell line pattern. Accordingly, a method of controlling the line width of the outermost cell line pattern which is adjacent to the dummy line pattern of which pitch is limited, that is, a method of making a wider line width of the outermost cell line pattern, is required.

SUMMARY OF THE INVENTION

Embodiments of the present invention are directed to proving a method of forming a line pattern array capable of controlling a line width of an outermost line pattern with different sizes at the time of forming an array of line patterns and a photomask having the same. In one embodiment of the present invention, a method of forming a line pattern array comprises designing a layout which includes first continuous line patterns arranged to have a first line width and a second continuous line pattern arranged to have a second line width larger than the first line width and positioned outside the first continuous line patterns; changing the outermost pattern of the first continuous line patterns, which is most closely adjacent to the second continuous line pattern, into a plurality of dotted patterns, wherein the plurality of dotted patterns are arranged in a line; and transferring the layout on a wafer with inducing light scattering by the dotted patterns to form a line pattern, which is different from the first continuous line patterns in line width, dependent on the size of the dotted patterns.

In another embodiment of the present invention, a method of forming a line pattern array comprises forming a photomask having a layout which includes first continuous line patterns arranged to have a first line width and a first space on a mask substrate, a second continuous line pattern arranged to have a second line width and a second space larger than the first line width and the first space of the first continuous line patterns and positioned outside of the first continuous line patterns, and a dotted line pattern in which a plurality of dotted patterns are arranged in a line form between the first continuous line patterns and the second continuous line pattern; and patterning and transferring the layout on a wafer by performing an exposure light process using the photomask, wherein the dotted line pattern forms on the wafer a third continuous line pattern having a line width dependent on the size of the dotted patterns.

In still another embodiment of the present invention, a semiconductor device comprises first line patterns formed by transferring on a wafer a mask layout which has first continuous line patterns to be arranged to have a first line width and a first space; a second line pattern formed by transferring on the wafer a mask layout which has a second continuous line pattern to be arranged to have a second line width and a second space larger than the first line width and the first space of the first continuous line patterns and positioned outside the first continuous line patterns; and a third line pattern formed by transferring on the wafer a dotted line pattern in which a plurality of dotted patterns are arranged in a line formed between the first continuous line patterns and the second continuous line pattern, whereby the third line pattern has a third line width, which is different from that of the first and second line patterns and dependent on the size of the dotted patterns.

In still another embodiment of the present invention, a photomask comprises first continuous line patterns arranged to have a first line width and a first space on a substrate; a second continuous line pattern arranged to have a second line width and a second space larger than the first line width and the first space of the first continuous line patterns and positioned outside the first continuous line patterns; and a dotted line pattern in which a plurality of dotted patterns are arranged in a line form between the first continuous line patterns and the second continuous line pattern.

DESCRIPTION OF SPECIFIC EMBODIMENTS

Figure 1:
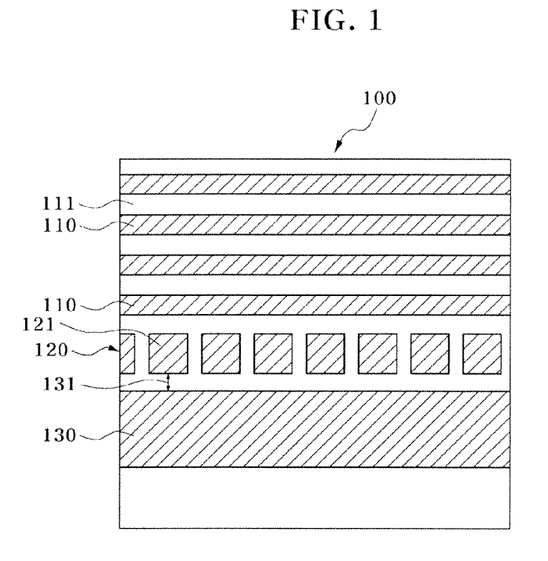
FIG. 1 is a view illustrating a mask layout having dotted line patterns according to an embodiment of the present invention.

Referring to FIG. 1, in a method of forming a line pattern array according to an embodiment of the present invention, a layout 100 of a mask pattern is formed on a transparent substrate such as quartz. At this time, line patterns, for example, cell patterns of a memory semiconductor device, are repeatedly designed on the layout 100. First, a layout having first continuous line patterns 110, which are arranged to have an equal first line width and an equal first space 111, can be designed. At the outer side of an array of the first continuous line patterns 110, a dotted line pattern 120, which has a plurality of dot patterns 121 arranged to make a line type, can be designed. Also, a second continuous line pattern 130 is arranged to have a second line width and a second space 131, which are respectively larger than the first line width and the first space 111 of the first continuous line patterns 110, can be designed at the outer side of the dotted line pattern 120. That is, the dotted line pattern 120 is formed between the first and second continuous line patterns 110 and 130.

For example, the first continuous line patterns 110 of the layout 100 can be designed to actually provide an array of first gate patterns of cell transistors of a DRAM memory device on a wafer. The dotted line pattern 120 is designed to be adjacent to the first gate patterns in order to make a second gate pattern having a third line width which is larger than the first line width. The second continuous line pattern 130 can be designed to be positioned outside the second gate patterns in order to form a dummy line pattern which suppresses an inducement to a local etching loading effect which is caused by the etching process after the formation of wafer patterns, namely, photoresist patterns. Therefore, the second continuous line pattern 130 can be designed to have a line width larger than both the line width of the first continuous line patterns 110 and the line width of the dot patterns 121 of the dotted line pattern 120.

In case that the first continuous line patterns 110 are designed to be exposed and transferred into the first gate patterns having a target line width of approximately 60 nanometers on the wafer and etched, the third continuous line patterns 130 are designed to have a line width of approximately 300 nanometers, substantially more than three or four times larger than the first gate patterns. Meanwhile, in case of a DRAM device, the dotted line pattern 120 is transferred into outermost cell gate patterns. In case of the outermost cell gate patterns, they are formed to have a line width, for example, approximately 10 to 20 nanometers larger than inner cell gate patterns. The reason for making the line width of the outermost cell gate patterns larger is to suppress an occurrence of an undesirable signal disturbance when a memory device operates, and to improve resistance.

Meanwhile, the first continuous line patterns 110 of the layout 100 of FIG. 1 are transferred into an array of the first gate patterns of the cell transistors of a flash memory device. In this embodiment, the dotted line pattern 120 can be designed to be transferred into second line gate patterns of the outer cell transistors, which are adjacent to the first gate patterns on the wafer and have a third line width which is larger than the first line width.

The second continuous line patterns 130 are designed to be transferred into third line gate patterns of selection transistors, which select cell transistors when the flash memory device operates. At this time, a size of the third gate patterns of the second continuous line patterns 130 can be set to be a relatively large size which is required for the selection transistors. The line width of the second line gate patterns, which are adjacent to the third line gate patterns, is set to be relatively larger than the line width of the first line gate patterns of other inner cell transistors in order to suppress an occurrence of an undesirable signal disturbance when the flash memory device operates and to improve resistance.

The dotted line pattern 120 is adjacent to the first continuous line patterns 110 in one direction and is adjacent to the second continuous line patterns 130 in the opposite direction. Since a second line width and a second space 131 of the second continuous line patterns 130 are set to be relatively larger than the line width and the space of the first continuous line patterns 110, a local optical proximity effect can affect an image of the dotted line pattern 120 at the time of an exposure of the dotted line pattern 120 due to the relatively larger pitch of the second continuous line patterns 130. Also, since the dot patterns 121 are repetitively arranged in the dotted line pattern 120, a light scattering effect is induced by the dot patterns 121. The light scattering effect induces an offset to the local optical proximity effect because of the large pitch of the second continuous line patterns 130.

Figure 2:
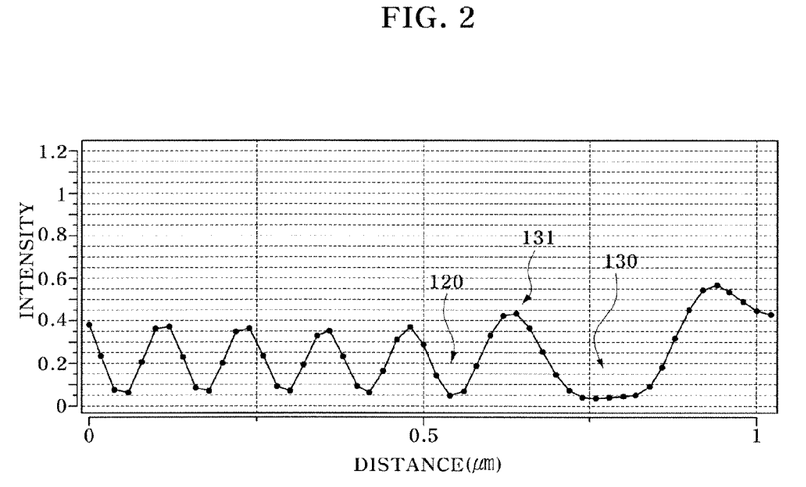
FIG. 2 is a graph of exposure light intensity versus position at the time of an exposure using the mask of FIG. 1.

Referring to FIG. 2, an exposure light intensity distribution of the layout 100 of FIG. 1, in which the mask patterns are formed on a substrate, is shown through a layout simulation model of the wafer exposure process. The exposure light intensity distribution in a vertical direction of the layout 100 of FIG. 1 is shown as the graph of FIG. 2. In order to evaluate a result of the graph of FIG. 2, a reference layout 300 is shown in FIG. 3.

The reference layout 300 may be correspondent to a line pattern without having dotted line patterns. The reference layout 300 includes a plurality of first continuous line patterns 310 of a first line width (CD) and space 311 and a second continuous line pattern 330, which is disposed at the outer side of the first continuous line patterns 310, and a second line width and a space 331 of the second line pattern 330 are larger than those of the first line patterns. Also, a third continuous line pattern 320, which is included in the reference layout 300, has a line width which is correspondent to that of the dotted line pattern 130 of FIG. 1. Referring to FIGS. 1 and 3, the third continuous line pattern 320 of FIG. 3 may be a modification of the dotted line pattern 120 having the plurality of the dot patterns 121 of FIG. 1.

Figure 3:
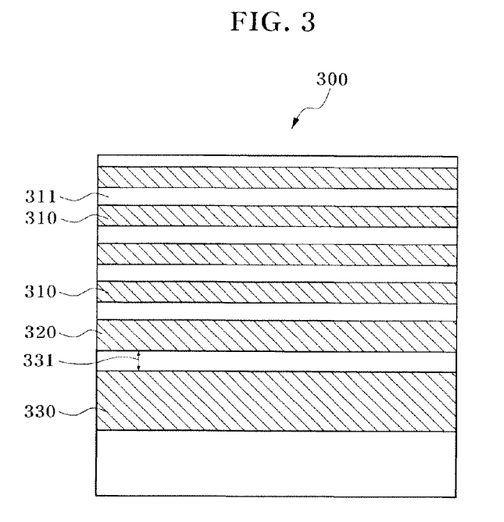
FIG. 3 is a view of a mask layout of a reference line pattern array to show an effect according to an embodiment of the present invention.
Figure 4:
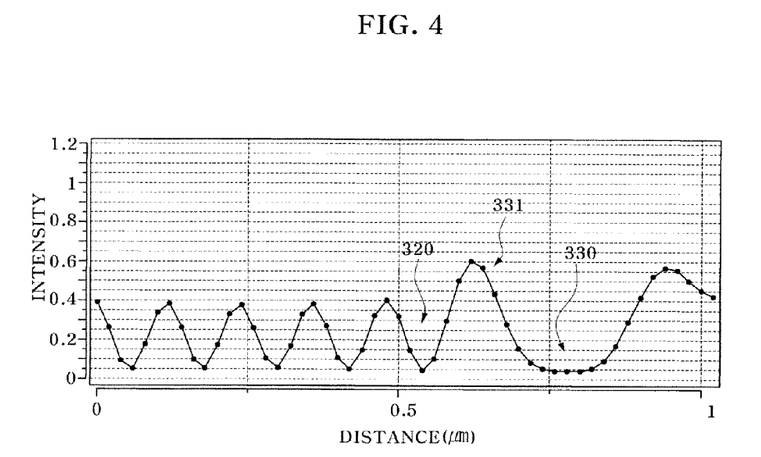
FIG. 4 is a graph of exposure light intensity versus position at the time of an exposure using the mask of FIG. 3.

Referring to FIG. 4, an exposure light intensity distribution of the layout 300 of FIG. 3, in which the mask patterns are formed on a substrate, is shown as a layout simulation result of the wafer exposure process. Referring to FIGS. 2 and 4, an exposure light intensity related to the space 131 of FIG. 2 is relatively lower, compared with a corresponding exposure light intensity related to the space 331 of FIG. 4. Also, as shown in the results of FIGS. 2 and 4, a contrast of the dotted line pattern 120 of FIG. 2 is relatively lower than that of the third continuous line patterns 320 of FIG. 4. Further, an inclination of the exposure light intensity related to the space 131 of FIG. 2 is measured as relatively mitigated, compared with an inclination of the exposure light intensity related to the space 331 of FIG. 4.

In case that the inclination of the light intensity in FIG. 2 is mitigated, a size of the line width of a photoresist pattern, actually exposed and formed on a wafer, may be changed more directly by the change of the line width of the dotted line pattern 120. Therefore, the intensity and contrast of the exposure light, induced around the dotted line pattern 120, can be controlled depending on the size of the line width of the dotted line pattern 120, particularly the size of the dot patterns 121, according to one embodiment of the present invention.

Figure 5A:
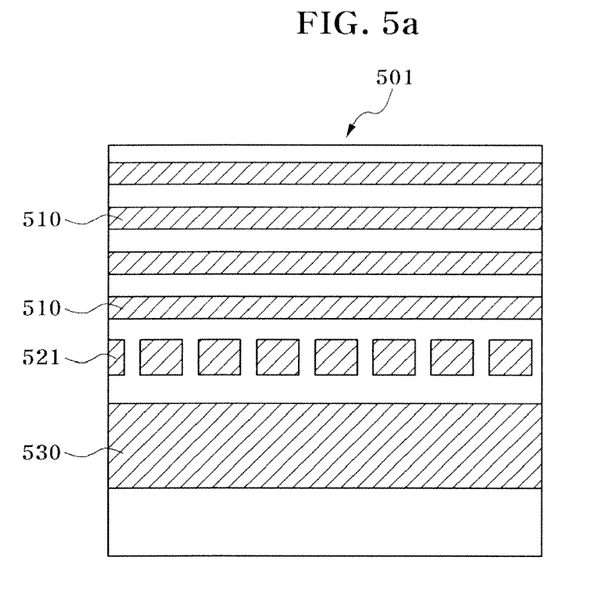
FIGS. 5a to 5c are layouts illustrating an effect of a method of forming a line pattern array according to an embodiment of the present invention.
Figure 5B:
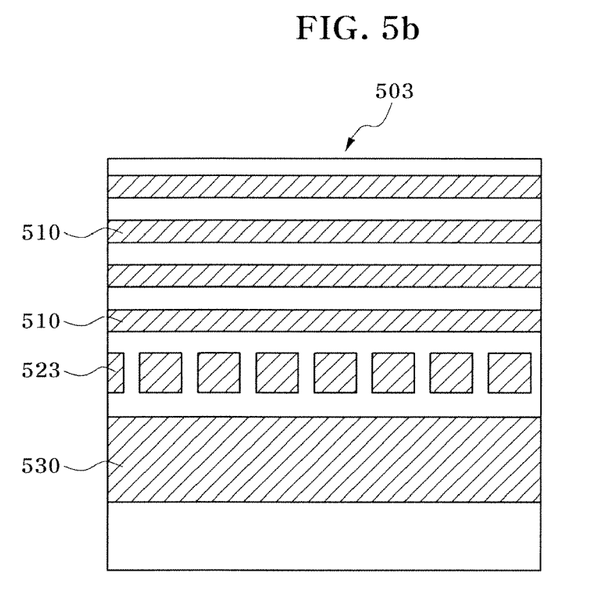
Figure 5C:
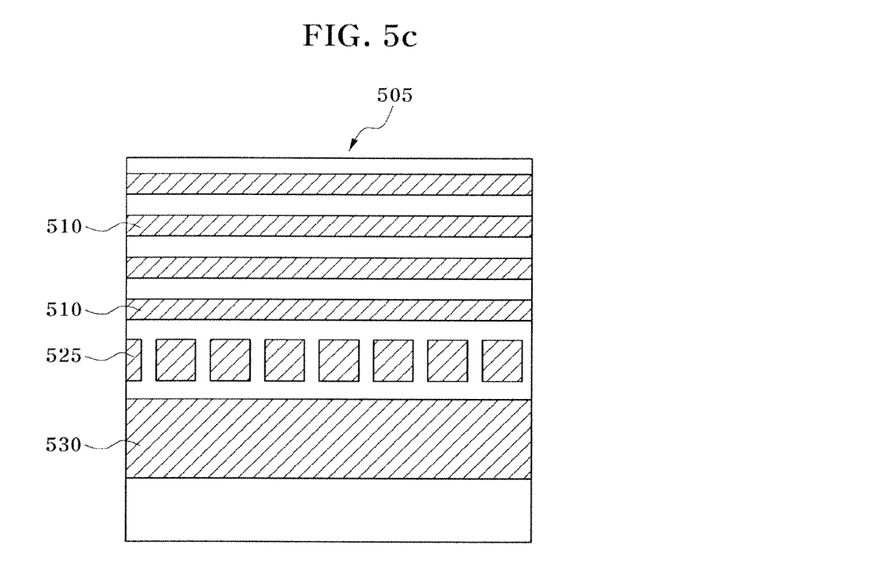
Figure 6A:
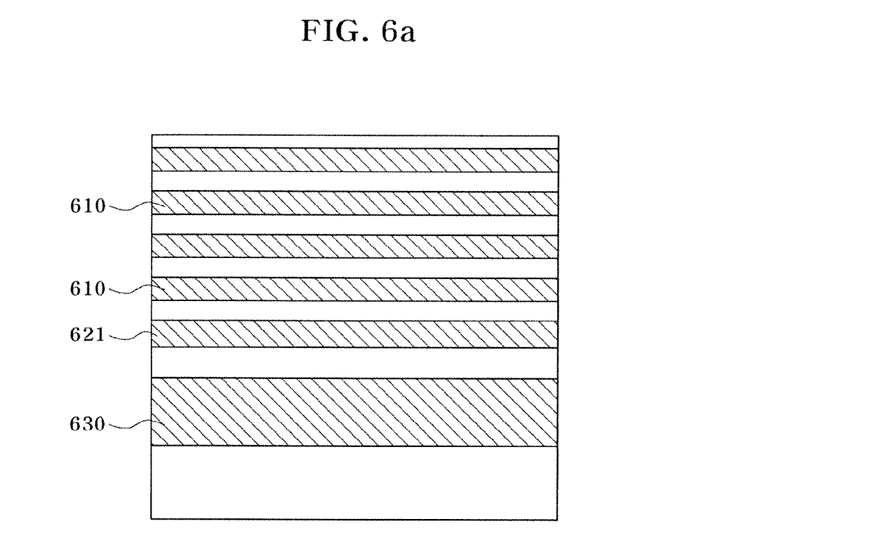
FIGS. 6a to 6c are views showing simulation results of patterns based on the layouts of FIGS. 5a to 5c.
Figure 6B:
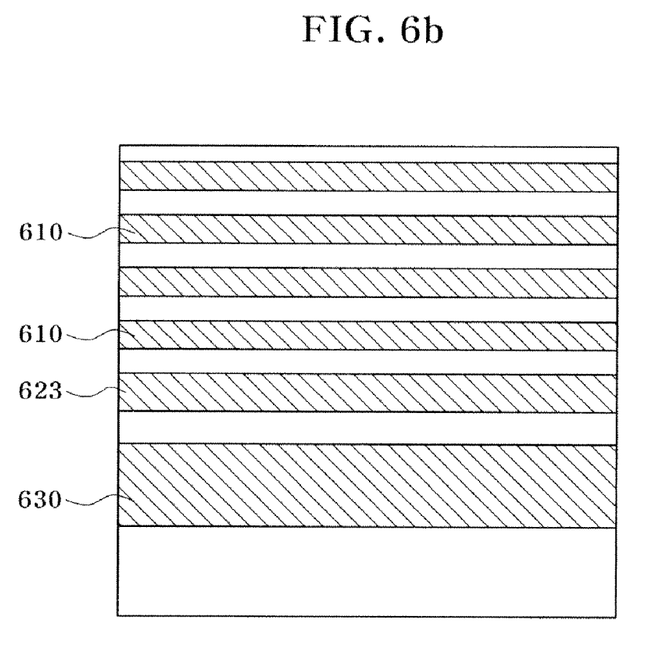
Figure 6C:
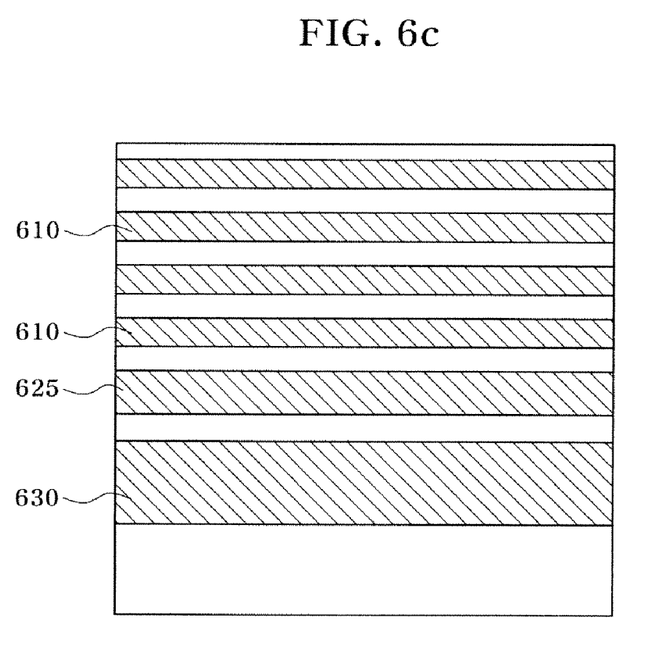

Referring to FIGS. 5a to 6c, simulation results of an exposure for layouts 501, 503 and 505, which are respectively shown in FIGS. 5a to 5c, are shown as layouts of FIGS. 6a to 6c. The results show an effect that a size of the photoresist pattern actually formed on the wafer is controllable by an introduction of the dotted line pattern (reference numeral 120 of FIG. 1). The layout 501 of FIG. 51 is a reference layout, including first continuous line patterns 510, a dotted line pattern 521 and a second continuous line pattern 530. At this time, the first continuous line patterns 510 and the dotted line pattern 521 are set as a layout which forms wafer patterns having a target line width of 60 nanometers on the actual wafer, for example, cell gate patterns. The layout 503 of FIG. 5b is a layout which has a dotted line pattern 523 of which line width is increased by 10 nanometers, compared with a size of the dotted line pattern 521 of FIG. 5a. The layout 505 of FIG. 5c is a layout which has a dotted line pattern 525 of which line width is increased by 20 nanometers, compared with the size of the dotted line pattern 521 of FIG. 5a.

FIG. 6a shows a simulation result of patterning and transferring the layout 501 of FIG. 5a, for example, a simulation result of utilizing a simulation model of an exposure and development process. As a result of the simulation, the first continuous line patterns 510 are transferred into first photoresist patterns 610, the dotted line pattern 520 is transferred into a second photoresist pattern 621 and the second continuous line pattern 530 is transferred into a third photoresist pattern 630. FIG. 6b shows a result of the simulation of the layout 503 of FIG. 5b and FIG. 6c shows a result of the simulation of the layout 505 of FIG. 5c.

In these embodiments, if line widths of the second photoresist patterns 621, 623 and 625, which correspond to their respective dotted line patterns 521, 523 and 525, are measured, the line width of the second photoresist pattern 621 is measured to be approximately 81 nanometers in case of FIG. 6a, the line width of the second photoresist pattern 623 is measured to be approximately 88 nanometers in case of FIG. 6b and the line width of the second photoresist pattern 625 is measured to be approximately 95 nanometers in case of FIG. 6c. That is, according as the line widths of the dotted line patterns 521, 523 and 525 in the layouts 501, 503 and 505 respectively increase by 10 nanometers, the line widths of the second photoresist patterns 621, 623 and 625 respectively increase by 7 nanometers. Since the photoresist patterns are results of a simulation of the photoresist pattern formation after a development, the measured line widths are regarded as the actual line widths after the development of the photoresist patterns.

Accordingly, the line width of the photoresist patterns formed on the wafer by an exposure can be changed by changing the line width of the dotted line pattern (reference numeral 120 of FIG. 1) or the line width of the dotted patterns (reference numeral 121 of FIG. 1) according to one embodiment of the present invention. Thus, the line width of a line pattern can be controlled to be larger within the limited pattern pitch.

Referring again to FIG. 1, in order to transfer the designed layout 100 on the wafer, a photomask having a mask pattern according to the designed layout 100 is formed, an exposure using the mask is performed so that a photoresist layer on the wafer is exposed and developed, and a wafer pattern corresponding to a photoresist pattern is finally formed. In this embodiment, the dotted line pattern 120 is transferred on the wafer as a continuous line pattern and the size of the line width changes depending on the size of the dot patterns 121. Also, according as the size of the dot patterns 121 gets larger, the size of the line widths of the continuous line patterns on the wafer gets larger.

On the other hand, the mask can be formed in a binary mask structure in which the first and second continuous line patterns 110 and 130 and the dot patterns 121 include a light blocking layer such as a chrome layer. Also, the mask can be formed so that the first and second continuous line patterns 110 and 130 and the dot patterns 121 include a phase shift layer or a halftone layer such as a molybdenum (Mo) layer or a molybdenum silicon nitride (MoSiN) layer, and thus the photomask can be formed in a halftone mask structure or a phase shift mask structure. In case of the phase shift mask, the first and second continuous line patterns 110 and 130 and the dot patterns 121 are formed into a recess for a phase difference which is caused by etching a surface of a quartz mask substrate.

According to the present invention, a mask layout of a pattern having a smaller pitch, which is adjacent to another pattern of a relatively large pitch, can be changed into a dotted line pattern layout. The size of a line width of the pattern is controllable without a change of a pattern pitch by performing an exposure process using a photomask in which such a layout is implemented. The size of an outermost cell gate pattern which is adjacent to a dummy pattern or the size of a cell gate pattern which is adjacent to a selection gate pattern of a selection transistor of a flash memory device can be induced to have a larger line width by controlling a layout of an exposure mask. Furthermore, since a part of the layout of the exposure mask is changed into a dotted line pattern, an improvement of a focus margin at the time of an exposure can be induced and an improvement of an exposure lattice margin can be induced due to a light scattering effect by the dotted line pattern.

What is claimed is:

1. A method of forming a line pattern array, comprising:
designing a layout which includes first continuous line patterns arranged to have a first line width and a second continuous line pattern positioned outside the first continuous line patterns and arranged to have a second line width larger than the first line width;
changing the layout such that the outermost pattern of the first continuous line patterns, which is most closely adjacent to the second continuous line pattern, is a plurality of dotted patterns, wherein the plurality of dotted patterns are arranged in a line; and
transferring the layout on a wafer with inducing light scattering by the dotted patterns to form a line pattern, which is different from the first continuous line patterns in line width, dependent on the size of the dotted patterns.

2. The method of claim 1, comprising increasing the line width of the line pattern which is transferred on the wafer by the dotted patterns by increasing the size of the dotted patterns.

3. The method of claim 1, comprising transferring the first continuous line patterns and the dotted line pattern transfer into an array of gate patterns on the wafer and transferring the second continuous line pattern into a dummy line pattern.

4. The method of claim 1, comprising transferring the first continuous line patterns and the dotted line pattern transfer into an array of first gate patterns of cell transistors of a flash memory device on the wafer and transferring the second continuous line pattern into a second gate pattern of selection transistor of the flash memory device on the wafer.

5. A method of forming a line pattern array, comprising:
forming a photomask having a layout which includes first continuous line patterns arranged to have a first line width and a first space on a mask substrate; a second continuous line pattern positioned outside of the first continuous line patterns and arranged to have a second line width and a second space larger than the first line width and the first space of the first continuous line patterns, respectively; and a dotted line pattern in which a plurality of dotted patterns are arranged in a line adjacent to the first continuous line patterns in a first direction and adjacent to the second continuous line pattern in a second direction opposite to the first direction; and
transferring the layout on a wafer by performing an exposure process using the photomask,
wherein the dotted line pattern forms on the wafer a third continuous line pattern having a line width dependent on the size of the dotted patterns.

6. The method of claim 5, comprising increasing the line width of the third continuous line pattern, which is transferred on the wafer by the dotted patterns, by increasing the size of the dotted patterns.

7. The method of claim 5, comprising transferring the first continuous line patterns into an array of first gate patterns of cell transistors of a memory device, transferring the dotted line pattern into second gate patterns which are adjacent to the first gate patterns and have a larger third line width, and transferring the second continuous line pattern into a dummy line pattern which is positioned outside the second gate pattern.

8. The method of claim 5, comprising transferring the first continuous line patterns into an array of first gate patterns of cell transistors of a flash memory device, transferring the dotted line pattern into a second gate pattern of a cell transistor which are adjacent to the first gate patterns and have a larger third line width, and transferring the second continuous line pattern into a third gate pattern of a selection transistor which selects the cell transistors.

9. The method of claim 5, comprising forming the photomask in a binary mask structure in which the first and second continuous line patterns and the dotted patterns include a light blocking layer.

10. The method of claim 5, comprising forming the photomask in a phase shift structure in which the first and second continuous line patterns and the dotted patterns include a phase shift layer.

11. The method of claim 5, comprising forming the photomask in a halftone structure in which the first and second continuous line patterns and the dotted patterns include a halftone layer.

12. A semiconductor device, comprising:
first line patterns formed by transferring on a wafer first continuous line patterns arranged with a first line width and a first space;
a second line pattern formed by transferring on the wafer a second continuous line pattern positioned outside the first continuous line patterns and arranged with a second line width and a second space larger than the first line width and the first space of the first continuous line patterns, respectively; and
a third line pattern formed by transferring on the wafer a dotted line pattern in which a plurality of dotted patterns are arranged in a line adjacent to the first continuous line patterns in a first direction and adjacent to the second continuous line pattern in a second direction opposite to the first direction, whereby the third line pattern has a third line width, which is different from that of the first and second line patterns and dependent on the size of the dotted patterns.

13. The semiconductor device of claim 12, comprising forming the first line patterns into first gate patterns of cell transistors of a memory device, forming the third line pattern into second gate patterns which are adjacent to the first gate patterns and have a larger third line width, and forming the second line pattern into a dummy pattern.

14. The semiconductor device of claim 12, comprising forming the first line patterns into first gate patterns of cell transistors of a flash memory device, forming the third line pattern into a second gate pattern which are adjacent to the first gate patterns and have a larger third line width, and forming the second line pattern into a third gate pattern of selection transistor which selects the cell transistors.

15. A photomask comprising:
first continuous line patterns arranged to have a first line width and a first space on a substrate;
a second continuous line pattern positioned outside the first continuous line patterns and arranged to have a second line width and a second space larger than the first line width and the first space of the first continuous line patterns, respectively; and a dotted line pattern in which a plurality of dotted patterns are arranged in a line adjacent to the first continuous line patterns in a first direction and adjacent to the second continuous line pattern in a second direction opposite to the first direction.

16. The photomask of claim 15, wherein the first continuous line patterns provide an array of first gate patterns of cell transistors of a memory device, wherein the dotted line pattern provides a second gate pattern which is adjacent to the first gate patterns and has a larger third line width, and wherein the second continuous line pattern provides a dummy pattern to suppress a local etching loading effect at an outside of the second gate pattern.

17. The photomask of claim 15, wherein the first continuous line patterns provide an array of first gate patterns of cell transistors of a flash memory device, wherein the dotted line pattern provides a second gate pattern of a cell transistor which is adjacent to the first gate patterns and has a larger third line width, and wherein the second continuous line pattern provides a third gate pattern of selection transistor which selects the cell transistors.

18. The photomask of claim 15, wherein the first and second continuous line patterns and the dotted patterns include a light blocking layer.

19. The photomask of claim 15, wherein the first and second continuous line patterns and the dotted patterns include a phase shift layer.

20. The photomask of claim 15, wherein the first and second continuous line patterns and the dotted patterns include a halftone layer.

* * * * *